(12) United States Patent
Midtgaard et al.

(10) Patent No.: US 7,129,790 B2
(45) Date of Patent: Oct. 31, 2006

(54) PHASE-LOCKED LOOP CIRCUIT

(75) Inventors: Jacob Midtgaard, Frederiksberg (DK); Oluf Bagger, Copenhagen (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/518,329

(22) PCT Filed: May 24, 2002

(86) PCT No.: PCT/EP02/05722

§ 371 (c)(1),
(2), (4) Date: Nov. 2, 2005

(87) PCT Pub. No.: WO03/100978

PCT Pub. Date: Dec. 4, 2003

(65) Prior Publication Data

US 2006/0114068 A1    Jun. 1, 2006

(51) Int. Cl.
*H03L 7/00* (2006.01)

(52) U.S. Cl. ............................ 331/16; 331/74; 331/175

(58) Field of Classification Search .................. 331/16, 331/74, 175
See application file for complete search history.

(56) References Cited

U.S. PATENT DOCUMENTS 5,430,416 A * 7/1995 Black et al. ................. 332/145
5,982,233 A    11/1999 Hellmark et al. ........... 330/149

FOREIGN PATENT DOCUMENTS

EP    0 998 088 A2    5/2000
EP    1 052 770 A1    11/2000

* cited by examiner

*Primary Examiner*—Arnold Kinkead
(74) *Attorney, Agent, or Firm*—Perman & Green, LLP

(57) ABSTRACT

A phase-locked loop circuit has an output amplifier (27) and a main feedback path from the output of the output amplifier (27). A subsidiary feedback path is provided directly from the output of the circuit's VCO (32). At the start of operation, the output amplifier (27) is disabled and the subsidiary feedback path is used until lock is achieved. Then the output amplifier (27) is enabled and the main feedback loop is used. This avoids spurious outputs from the outer amplifier while to loop locks.

10 Claims, 4 Drawing Sheets

PHASE-LOCKED LOOP CIRCUIT

This application is the National Stage of International Application No. PCT/EP02/05722, International Filing Date, May 24, 2002, which designated the United States of America, and which international application was published under PCT Article 21(2) as WO Publication No. WO 03/100978 A1.

FIELD OF THE INVENTION

The present invention relates to a phase locked loop circuit.

BACKGROUND TO THE INVENTION

The present trend in portable communications devices such as mobile telephones is to increasingly lightweight devices with increased talk-time between battery recharge cycles. Such developments require ever more efficient radio-frequency (RF) amplifiers to minimise power consumption. In cellular systems such as GSM, the modulation scheme is a constant amplitude scheme, also referred to as constant envelope modulation, which permits use of efficient non-linear amplifiers. However, recent types of communication system such as EDGE and UMTS use non-constant envelope modulation schemes. The drawback is that the amplification of non-constant envelope RF signals requires the use of linear power amplifiers, which are inherently less efficient. The lower power efficiency of linear amplifiers translates into higher power consumption and higher heat dissipation.

A variety of linearisation architectures and schemes exist, including fixed and adaptive pre-distortion, adaptive bias, envelope elimination and restoration, polar loop and Cartesian loop transmitters. Details of such devices are shown in "Increasing Talk-Time with Efficient Linear PA's", IEE Seminar on TETRA Market and Technology Developments, Mann S, Beach M, Warr P and McGeehan J, Institution of Electrical Engineers, 2000, which is incorporated herein by reference. However, many of these devices and techniques are unsuitable for battery operated portable devices such as mobile telephones, or are incapable of meeting current RF design standards, such as the TETRA linearity standard, ETSI publication ETS 300 396-2; "Trans-European Trunked Radio (TETRA);—Voice plus Data (V+D)—Part 2: Air Interface (AI)"; March 1996.

Envelope elimination and restoration (EER) transmitters separate envelope and phase information from an input modulated signal. The phase information is then passed through a power amplifier as a constant envelope signal, permitting the use of efficient, non-linear amplifiers, while the envelope signal is added to the power amplifier output. In order to correct AM-PM distortion, phase feedback is employed and the power amplifier is effectively placed within phase-locked loop.

A problem arises in the spurious emissions are generated by the power amplifier in the period before the loop is locked at the beginning of a transmission.

SUMMARY OF THE INVENTION

According to the present invention, there is provided a phase-locked loop circuit comprising an oscillator controlled in dependence on the output of a phase detector, an output amplifier for amplifying the output of the oscillator and a feedback path to the phase detector from the output of the output amplifier, characterised by a second feedback path from the output of the oscillator to the phase detector, by-passing the output amplifier, and control means for disabling the output amplifier when the loop circuit is not locked and interrupting the second feedback path when the loop circuit has become locked.

Thus, unwanted components in the output of the output amplifier can be avoided by ensuring that the amplifier does not become active until the loop has achieved lock.

Preferably, the second feedback path includes a variable gain amplifier, the control means being configured to interrupt the second feedback path by reducing the gain of the variable gain amplifier. More preferably, the control means is configured to interrupt the second feedback path by ramping down the gain of the variable gain amplifier. Still more preferably, the control means is configured to ramp up the gain of output amplifier on enabling thereof, the ramping down of the gain of the variable gain amplifier overlapping the ramping up of the gain of output amplifier. Phase control means may be included for matching the phase of the output of the variable gain amplifier to that of the output of the output amplifier when both are operating. Such phase control means may comprise a variable delay in the second feedback path, a phase detector receiving a signal from the second feedback path downstream of the variable delay and a signal from the first feedback path and a low-pass filter for filtering the output of the phase detector to provide a delay control input signal for the variable delay.

Preferably, the first and second feedback paths share a common portion. More preferably, the first and second feedback paths are united by a summer and/or the common portion includes a frequency down converter.

A circuit according to the present invention may be advantageously employed in an envelope elimination and restoration transmitter such that the first feedback path provides a feedback signal for a closed loop envelope restoration circuit and the control means includes an envelope controller for controlling the gain of the output amplifier.

A circuit according to the present invention may be advantageously employed in a mobile phone such that the output amplifier is an RF power amplifier.

DETAILED DESCRIPTION OF THE PREFERRED EMBODIMENTS

Embodiments of the invention will now be described by way of example with reference to the accompanying drawings.

Figure 1:
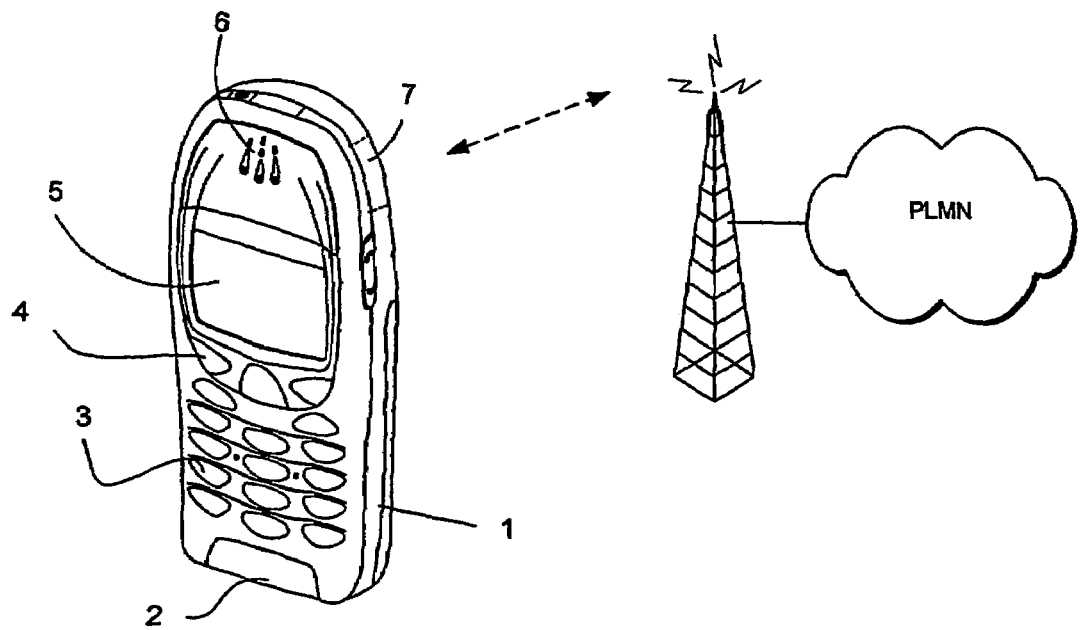
FIG. 1 is a perspective view of a mobile telephone handset.

Referring to FIG. 1, a mobile station in the form of a mobile telephone handset 1 includes a microphone 2, keypad 3, with soft keys 4 which can be programmed to perform different functions, an LCD display 5, a speaker 6 and an antenna 7 which is contained within the housing.

The mobile station 1 is operable to communicate through cellular radio links with individual public land mobile networks (PLMNs) operating according to communication schemes such as UMTS and EDGE.

Figure 2:
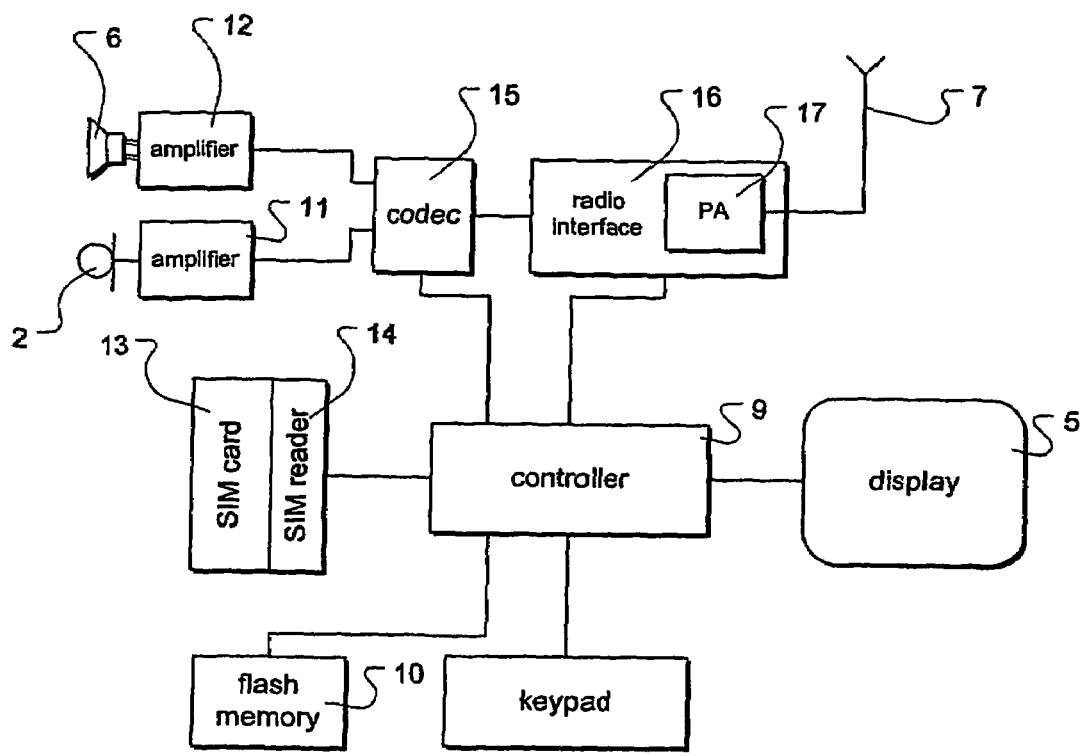
FIG. 2 is a schematic diagram of mobile telephone circuitry for use in the telephone handset of FIG. 1.

FIG. 2 illustrates the major circuit components of the telephone handset 1. Signal processing is carried out under the control of a digital micro-controller 9 which has an associated flash memory 10. Electrical analogue audio signals are produced by microphone 2 and amplified by pre-amplifier 11. Similarly, analogue audio signals are fed to the speaker 6 through an amplifier 12. The micro-controller 9 receives instruction signals from the keypad and soft keys 3, 4 and controls operation of the LCD display 5.

Information concerning the identity of the user is held on a smart card 13 in the form of a GSM SIM card which contains the usual GSM international mobile subscriber identity (IMSI) and an encryption key $K_i$ that is used for encoding the radio transmission in a manner well known per se. The SIM card is removably received in a SIM card reader 14.

The mobile telephone circuitry includes a codec 15 and an rf stage 16 including a power amplifier stage 17 feeding the antenna 7. The codec 15 receives analogue signals from the microphone amplifier 11, digitises them into an appropriate signal format and feeds them to the power amplifier stage 17 in the rf stage 16 for transmission through the antenna 7 to the PLMN shown in FIG. 1. Similarly, signals received from the PLMN are fed through the antenna 7 to be demodulated in the rf stage 16 and fed to codec 15, so as to produce analogue signals fed to the amplifier 12 and speaker 6.

Figure 3:
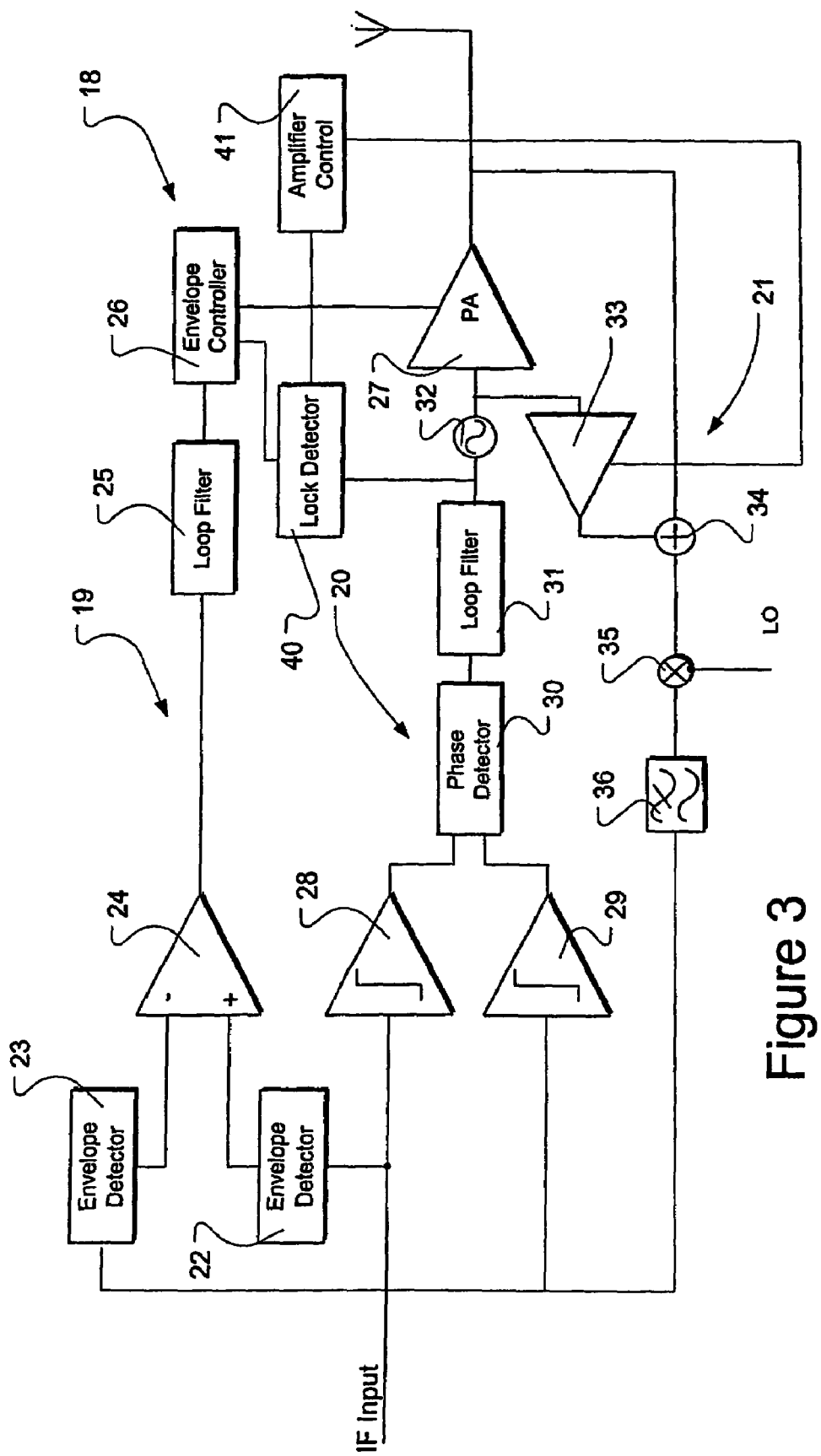
FIG. 3 is a block diagram of a first embodiment of the present invention.

Referring to FIG. 3, the power amplifier stage 17 comprises an envelope elimination and restoration (EER) transmitter 18 which separates the envelope and phase components of an input modulated IF signal into two separate forward paths 19, 20. A common feedback path 21 is used for control of both the envelope and phase components of the RF output by the amplifier stage 17.

The envelope forward path 19 comprises first and second envelope detectors 22, 23 which detect the envelopes of the input modulated IF signal and the feedback signal from the feedback path 21 respectively. The outputs of the envelope detectors 22, 23 are fed to respective inputs of a comparator 24. The output of the comparator 24 is filtered by a low-pass filter 25 and applied to an envelope controller 26.

The envelope controller 26 comprises a fast power supply modulator which directly modulates the supply voltage of the power amplifier 27 itself.

The phase forward path 20 comprises first and second limiters 28, 29 which limit the input modulated IF signal and the feedback signal respectively to produce respective constant-amplitude signals. The constant amplitude signals are applied to a phase detector 30 and the output of the phase detector 30 is filtered by a low-pass filter 31 and applied to a voltage-controlled oscillator 32 as is conventional in a phase-lock loop. The RF signal produced by the voltage-controlled oscillator 32 is input into the power amplifier 27 which amplifies it in dependence on the signal input to the envelope controller 26.

The output of the voltage-controlled oscillator 32 is also fed to a variable gain amplifier 33 which forms a branch of the common feedback path 21. A summer 34 receives the output of the variable gain amplifier 33 and the power amplifier 27 on respective inputs. The output of the summer 34 is connected to one input of a mixer 35. The other input of the mixer 35 receives a local oscillator signal. The output of the mixer is low-pass filtered by a feedback path filter 36 to select a low frequency mixing product. Thus, the mixer 35 and filter 36 act to down convert the RF output of the amplifier 27 to the IF signal frequency.

The output of the feedback path filter 36 is fed to the inputs of the second envelope detector 23 and the second limited 29 to complete the feedback paths of the envelope and phase control loops.

A lock detector 40 is provided to detect when the phase locked loop is locked. The lock detector 40 provides a control signal to the envelope controller 26 which disables the power amplifier 27 when the loop is not locked and enables the power amplifier 27 when the loop is locked.

The output of the lock detector 40 is also input into an amplifier control circuit 41 which produces a gain control signal for the variable gain amplifier 33. When the loop is not locked, the amplifier control circuit 41 outputs a circuit that keeps the variable gain amplifier's gain at a maximum. However, when lock is achieved and the output of the lock detector 40 changes state, the amplifier control circuit 41 outputs a signal that causes the gain of the variable gain amplifier 33 to decay to zero.

Figure 4:
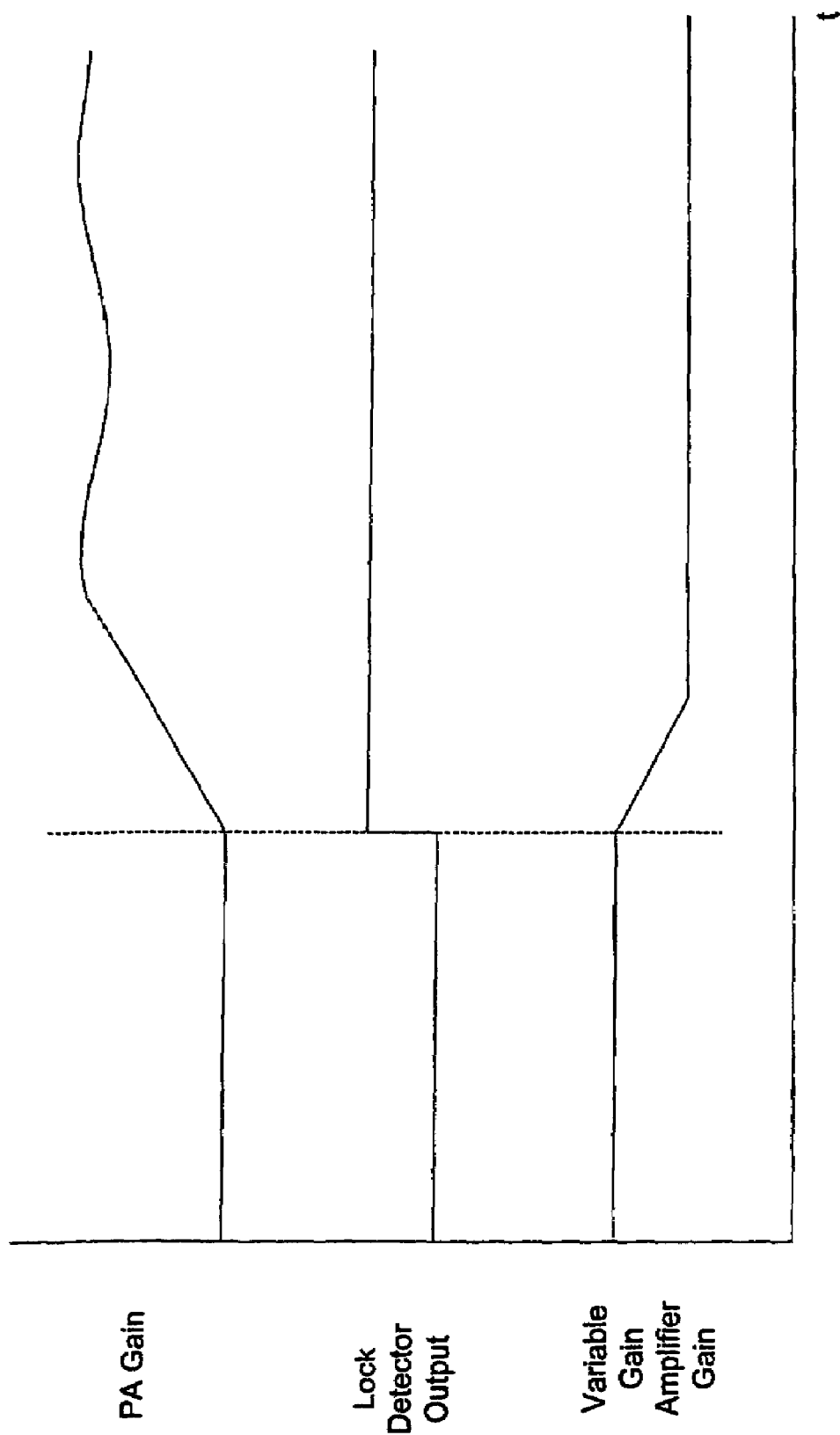
FIG. 4 illustrate the initiation of a transmission by the embodiment shown in FIG. 3.

Referring to FIG. 4, when a transmission is not being made, the power amplifier 27 is disabled and the voltage-controlled oscillator 32 runs freely, although it could also be disabled in the absence of an input IF signal.

When an IF signal is initially input, the voltage-controlled oscillator 32 is locked to the input IF signal by the action of the loop comprising the voltage-controlled oscillator 32, the variable gain amplifier 33, the mixer 35, the feedback path filter 36, the second limiter 29, the phase detector 30 and the low-pass filter 31. Since the power amplifier 27 is not producing an output, the summer 34 can be disregarded. During this period the frequency and phase of the voltage-controlled oscillator 32 vary until lock is achieved. Once lock has been achieved and the frequency and phase of the voltage-controlled oscillator 32 have stabilised, the output of the lock detector 40 changes state and the power amplifier 27 is enabled. The gain of the power amplifier 27 is ramped up to avoid sharp transitions in the output RF signal. While the gain of the power amplifier 27 is ramping up, the gain of the variable gain amplifier is ramped down by the amplifier control circuit 41 so that the feedback signal becomes dominated by the output of the power amplifier 27 and then completely dependent on the output of the power amplifier 27.

The gain of the variable gain amplifier 33 is ramped down while the gain of the power amplifier 27 is ramping up to ensure that the amplitude of feedback signal is always sufficient to be limited by the second limiter 29.

Figure 5:
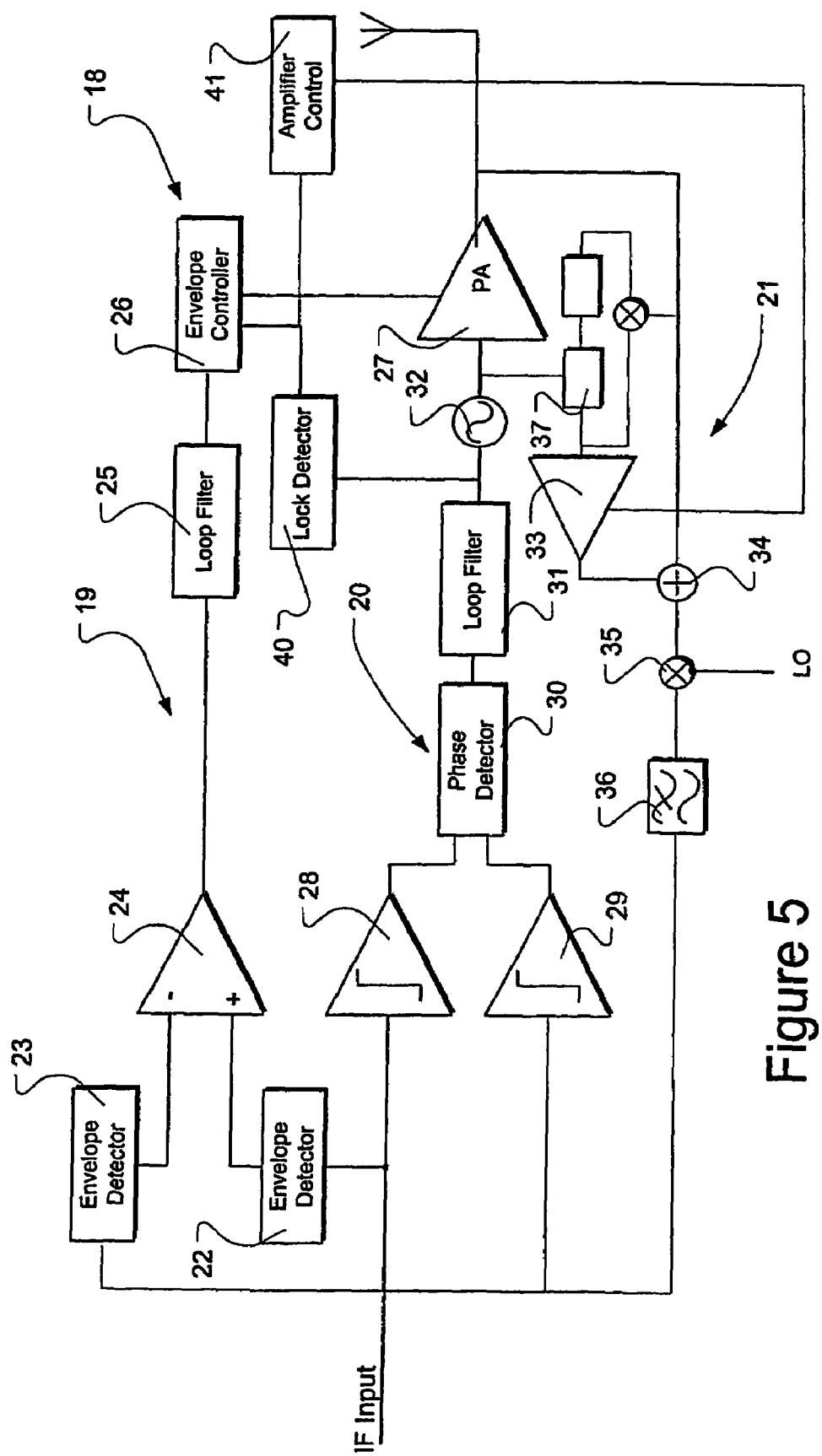
FIG. 5 is a block diagram of a second embodiment of the present invention.

Referring to FIG. 5, a second embodiment is substantially the same as the first embodiment, described above, except that a delay locked loop is added to the control the phase of the signal input to the variable gain amplifier 33. The delay locked loop is used so that during the transition from control on the basis of the voltage-controlled oscillator output to control on the basis of the power amplifier output, the output from the variable gain amplifier 33 does not tend to cancel the feedback from the power amplifier 27 due to a significant phase difference between the signals.

The delay locked loop comprises a voltage-controlled delay 37 for controllably delaying the output of the voltage-controlled oscillator 32 input into the variable gain amplifier 33, a phase detector 38 connected to receive the input to the variable gain amplifier 33 and the output of the power amplifier 27 as its inputs and a low-pass filter 39 for filtering the output of the phase detector 38 to provide a control signal for the voltage-controlled delay 37.

In another embodiment, the phase detector of the delay locked loop receives the outputs of the variable gain amplifier and the power amplifier as its inputs.

The invention claimed is:

1. A phase-locked loop circuit comprising:
   an oscillator controlled in dependence on the output of a phase detector;
   an output amplifier for amplifying the output of the oscillator;
   a first feedback path to the phase detector from the output of the output amplifier;
   a second feedback path from the output of the oscillator to the phase detector, by-passing the output amplifier; and
   control means for disabling the output amplifier when the loop circuit is not locked and interrupting the second feedback path when the loop circuit has become locked;
   wherein the second feedback path includes a variable gain amplifier and the control means is configured to interrupt the second feedback path by reducing the gain of the variable gain amplifier.

2. A circuit according to claim 1, wherein the control means is configured to interrupt the second feedback path by ramping down the gain of the variable gain amplifier.

3. A circuit according to claim 2, wherein the control means is configured to ramp up the gain of output amplifier on enabling thereof, the ramping down of the gain of the variable gain amplifier overlapping the ramping up of the gain of output amplifier.

4. A circuit according to claim 3, including phase control means for matching the phase of the output of the variable gain amplifier to that of the output of the output amplifier when both are operating.

5. A circuit according to claim 4, wherein the phase control means comprises a variable delay in the second feedback path, a phase detector receiving a signal from the second feedback path downstream of the variable delay and a signal from the first feedback path and a low-pass filter for filtering the output of the phase detector to provide a delay control input signal for the variable delay.

6. A circuit according to claim 1, wherein the first and second feedback paths share a common portion.

7. A circuit according to claim 6, wherein the first and second feedback paths are united by a summer.

8. A circuit according to claim 6, wherein said common portion includes a frequency down converter.

9. A circuit according to claim 1, wherein the first feedback path provides a feedback signal for a closed loop envelope restoration circuit of an envelope elimination and restoration transmitter, the control means including an envelope controller for controlling the gain of the output amplifier.

10. A circuit according to claim 1, wherein the output amplifier is an RF power amplifier of a mobile phone.

* * * * *

UNITED STATES PATENT AND TRADEMARK OFFICE
CERTIFICATE OF CORRECTION

PATENT NO. : 7,129,790 B2  
APPLICATION NO. : 10/518329  
DATED : October 31, 2006  
INVENTOR(S) : Midtgaard et al.

It is certified that error appears in the above-identified patent and that said Letters Patent is hereby corrected as shown below:

Title Page, item (75), delete "Copenhagen" and insert -- Frederiksburg--, therefore.

Signed and Sealed this

Tenth Day of April, 2007

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,129,790 B2 | Page 1 of 1 |
| APPLICATION NO. | : 10/518329 | |
| DATED | : October 31, 2006 | |
| INVENTOR(S) | : Midtgaard et al. | |

It is certified that error appears in the above-identified patent and that said Letters Patent is hereby corrected as shown below:

On Title Page, item 75, delete "Copenhagen" and insert -- Frederiksburg--, therefore.

Signed and Sealed this

Twenty-fourth Day of April, 2007

JON W. DUDAS
*Director of the United States Patent and Trademark Office*